(12) United States Patent
Susa (10) Patent No.: US 12,385,131 B2
(45) Date of Patent: Aug. 12, 2025

(54) METHOD OF FORMING A STRUCTURE INCLUDING A SILICON CARBIDE LAYER

(71) Applicant: ASM IP Holding B.V., Almere (NL)

(72) Inventor: Yoshio Susa, Tama (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/865,580

(22) Filed: Jul. 15, 2022

(65) Prior Publication Data

US 2023/0043629 A1 Feb. 9, 2023

Related U.S. Application Data

(60) Provisional application No. 63/223,621, filed on Jul. 20, 2021.

(51) Int. Cl.
| | |
|---|---|
| *C23C 16/00* | (2006.01) |
| *C23C 16/04* | (2006.01) |
| *C23C 16/32* | (2006.01) |
| *C23C 16/509* | (2006.01) |

(52) U.S. Cl.
CPC .......... *C23C 16/325* (2013.01); *C23C 16/045* (2013.01); *C23C 16/509* (2013.01)

(58) Field of Classification Search
CPC ...................................................... H01L 21/00
See application file for complete search history.

(56) References Cited

U.S. PATENT DOCUMENTS

| | | | | |
|---|---|---|---|---|
| 9,837,270 | B1* | 12/2017 | Varadarajan | ...... H01L 21/76826 |
| 10,435,790 | B2* | 10/2019 | Fukazawa | ......... H01L 21/76826 |
| 10,483,099 | B1 | 11/2019 | Blanquart | |
| 2004/0126929 | A1* | 7/2004 | Tang | ................. H01L 21/76829 |
| | | | | 438/118 |
| 2004/0161535 | A1* | 8/2004 | Goundar | ........... H01L 21/02167 |
| | | | | 427/249.15 |
| 2009/0093132 | A1* | 4/2009 | Xu | ...................... H01L 21/0217 |
| | | | | 257/E21.24 |
| 2012/0122302 | A1* | 5/2012 | Weidman | .......... H01L 21/02274 |
| | | | | 118/723 R |
| 2018/0119283 | A1* | 5/2018 | Fukazawa | ........... C23C 16/4412 |
| 2019/0055645 | A1* | 2/2019 | Li | ..................... H01L 21/02219 |
| 2020/0118815 | A1* | 4/2020 | Fukazawa | ........... H01L 21/0228 |
| 2022/0178023 | A1 | 6/2022 | Susa | |

\* cited by examiner

*Primary Examiner* — Gordon Baldwin
*Assistant Examiner* — Mohammad Mayy
(74) *Attorney, Agent, or Firm* — Snell & Wilmer L.L.P.

(57) ABSTRACT

Methods and systems for forming a structure including a silicon carbide layer and structures formed using the methods and systems are disclosed. Exemplary methods include providing a silicon carbide precursor to the reaction chamber, forming a plasma within the reaction chamber to form an initially flowable, viscous silicon carbide material on a surface of the substrate, wherein the initially viscous carbon material becomes the silicon carbide layer. Exemplary methods can include use of a silicon carbide precursor that includes a carbon-carbon triple bond and/or use of a relatively low plasma power density (e.g., less than 3 W/cm$^2$).

13 Claims, 5 Drawing Sheets

METHOD OF FORMING A STRUCTURE INCLUDING A SILICON CARBIDE LAYER

CROSS-REFERENCE TO RELATED APPLICATIONS

This application claims priority to U.S. Provisional Patent Application Ser. No. 63/223,621 filed Jul. 20, 2021 and titled METHOD OF FORMING A STRUCTURE INCLUDING A SILICON CARBIDE LAYER, the disclosure of which is hereby incorporated by reference in its entirety.

FIELD OF INVENTION

The present disclosure generally relates to methods of forming structures suitable for use in the manufacture of electronic devices. More particularly, examples of the disclosure relate to methods of forming structures that include a silicon carbide layer, to structures including such layers, and to systems for performing the methods and/or forming the structures.

BACKGROUND OF THE DISCLOSURE

During the manufacture of devices, such as semiconductor devices, it is often desirable to fill features (e.g., trenches or gaps) on the surface of a substrate with insulating or dielectric material. Some techniques to fill features include the deposition of a layer of flowable carbon material.

Recently, interest has gained in the use of silicon carbide as dielectric material in the formation of electronic devices. Silicon carbide can exhibit relatively high etch selectivity to silicon oxide and silicon nitride. However, silicon carbide layers can exhibit several shortcomings, particularly as the size of the features to be filled decreases. For example, during deposition of silicon carbide material, voids can form within the deposited material, particularly within gaps on a surface of the substrate. Further, techniques, such as plasma atomic layer deposition, can be relatively slow, and consequently relatively expensive.

Accordingly, improved methods for forming structures, particularly for methods of filling gaps on a substrate surface with silicon carbide, that mitigate void formation in the carbon material and/or that are relatively quick, are desired.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

Various embodiments of the present disclosure relate to methods of forming structures suitable for use in the formation of electronic devices. While the ways in which various embodiments of the present disclosure address drawbacks of prior methods and structures are discussed in more detail below, in general, exemplary embodiments of the disclosure provide improved methods for forming structures that include a layer including silicon carbide, structures including the layer of silicon carbide, and systems for performing the methods and/or forming the structures. The methods described herein can be used to fill features on a surface of a substrate.

In accordance with various embodiments of the disclosure, methods of forming a structure are provided. Exemplary methods include providing a substrate within a reaction chamber, providing a precursor to the reaction chamber, and applying plasma power to form a plasma within the reaction chamber, where the plasma power is less than about 3.0 W/cm$^2$ of a planar surface area of the substrate exposed to the plasma to form the layer comprising silicon carbide. In accordance with examples of the disclosure, the precursor includes a molecule comprising silicon and carbon. In accordance with further examples of the disclosure, the molecule comprises a carbon-carbon triple bond. A molecular weight of the molecule can be relatively high—e.g., greater than 150 Da. As set forth in more detail below, use of the relatively low power density allows most of a precursor molecule (e.g., the carbon-carbon triple bond and/or carbon-silicon bonds) to survive the plasma and bond or attach to a surface of a substrate. In accordance with further examples of these embodiments, a substrate temperature can be relatively low (e.g., less than 120° C.). The relatively low substrate temperature can allow active species to migrate along the substrate surface. In accordance with yet further examples, the method can be performed as a plasma-enhanced chemical vapor deposition method, which allows relatively fast and/or less expensive substrate processing.

In accordance with further examples of the disclosure, a method includes providing a substrate within a reaction chamber, providing a precursor to the reaction chamber, and applying plasma power to form a plasma within the reaction chamber, wherein the precursor includes a molecule comprising silicon and a carbon-carbon triple bond. A power used to form a plasma during the step of applying can be less than 3.0 W/cm$^2$ or between about 0.5 and about 3.0 W/cm$^2$.

In accordance with yet further exemplary embodiments of the disclosure, a structure is formed, at least in part, according to a method described herein.

In accordance with yet further exemplary embodiments of the disclosure, a system is provided for performing a method and/or for forming a film structure as described herein.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of depositing materials, to methods of forming structures, to structures formed using the methods, and to systems for performing the methods and/or forming the structures. By way of examples, the methods described herein can be used to fill features, such as gaps (e.g., trenches or vias) on a surface of a substrate with silicon carbide material. The terms gap and recess can be used interchangeably.

To mitigate void and/or seam formation during a gap-filling process, deposited silicon carbide material can be initially flowable and flow within the gap to fill the gap. Exemplary structures described herein can be used in a variety of applications, including, but not limited to, cell isolation in 3D cross point memory devices, self-aligned vias, dummy gates, reverse tone patterns, PC RAM isolation, cut hard masks, DRAM storage node contact (SNC) isolation, and the like.

In this disclosure, "gas" can refer to material that is a gas at normal temperature and pressure, a vaporized solid and/or a vaporized liquid, and may be constituted by a single gas or a mixture of gases, depending on the context. A gas other than a process gas, i.e., a gas introduced without passing through a gas distribution assembly, such as a showerhead, other gas distribution device, or the like, may be used for, e.g., sealing a reaction space, which includes a seal gas, such as a rare gas. In some cases, such as in the context of deposition of material, the term "precursor" can refer to a compound that participates in the chemical reaction that produces another compound, and particularly to a compound that constitutes a film matrix or a main skeleton of a film, whereas the term "reactant" can refer to a compound, in some cases other than a precursor, that activates a precursor, modifies a precursor, or catalyzes a reaction of a precursor. In some cases, the terms precursor and reactant can be used interchangeably. The term "inert gas" refers to a gas that does not take part in a chemical reaction to an appreciable extent and/or a gas that excites a precursor (e.g., to facilitate polymerization of the precursor) when, for example, power (e.g., RF power) is applied, but unlike a reactant, it may not become a part of a film matrix to an appreciable extent. Exemplary inert gasses include argon or helium. A carrier gas can be used to assist with transport of the precursor to the reaction chamber. In addition, the carrier gas can be used to ignite and/or maintain a plasma within a reaction chamber.

As used herein, the term "substrate" can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as Group III-V or Group II-VI semiconductors, and can include one or more layers overlying or underlying the bulk material. Further, the substrate can include various features, such as gaps (e.g., recesses or vias), lines or protrusions, such as lines having gaps formed therebetween, and the like formed on or within at least a portion of a layer or bulk material of the substrate. By way of examples, one or more features can have a width of about 10 nm to about 100 nm, a depth or height of about 30 nm to about 1,000 nm, and/or an aspect ratio of about 3.0 to 100.0.

In some embodiments, "film" refers to a layer extending in a direction perpendicular to a thickness direction. In some embodiments, "layer" refers to a material having a certain thickness formed on a surface and can be a synonym of a film or a non-film structure. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers. The layer or film can be continuous—or not.

As used herein, the term "silicon carbide" or "silicon carbide material" can refer to material whose chemical formula can be represented as including silicon and carbon. Layers comprising silicon carbide can include other elements, such as hydrogen. The silicon carbide need not be stoichiometric material.

As used herein, the term "structure" can refer to a partially or completely fabricated device structure. By way of examples, a structure can be a substrate or include a substrate with one or more layers and/or features formed thereon.

As used herein, the term "chemical vapor deposition" can refer to a vapor deposition process in which a substrate is exposed to one or more volatile precursors, which react and/or decompose on the substrate surface to produce the desired layer (e.g., silicon carbide).

In this disclosure, "continuously" can refer to without breaking a vacuum, without interruption as a timeline, without any material intervening step, without changing treatment conditions, immediately thereafter, as a next step, or without an intervening discrete physical or chemical structure between two structures other than the two structures in some embodiments and depending on the context.

A flowability (e.g., an initial flowability) can be determined as follows:

TABLE 1

| bottom/top ratio (B/T) | Flowability |
|---|---|
| 0 < B/T < 1 | None |
| 1 ≤ B/T < 1.5 | Poor |
| 1.5 ≤ B/T < 2.5 | Good |
| 2.5 ≤ B/T < 3.5 | Very good |
| 3.5 ≤ B/T | Extremely good | where B/T refers to a ratio of thickness of film deposited at a bottom of a recess to thickness of film deposited on a top surface where the recess is formed, before the recess is filled. Typically, the flowability is evaluated using a wide recess having an aspect ratio of about 1 or less, since generally, the higher the aspect ratio of the recess, the higher the B/T ratio becomes. The B/T ratio generally becomes higher when the aspect ratio of the recess is higher. As used herein, a "flowable" film or material exhibits good or better flowability.

As set forth in more detail below, flowability of film can be temporarily obtained when a volatile silicon carbide precursor, for example, is polymerized by a plasma and deposits on a surface of a substrate, wherein the gaseous precursor is activated or fragmented by energy provided by plasma gas discharge, so as to initiate polymerization. The resultant polymer material can exhibit temporarily flowable behavior. When a deposition step is complete and/or after a short period of time (e.g., about 3.0 seconds), the film may no longer be flowable, but rather becomes solidified, and thus, a separate solidification process may not be employed.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments. Further, in this disclosure, the terms "including," "constituted by" and "having" can refer independently to "typically or broadly comprising," "comprising," "consisting essentially of," or "consisting of" in some embodiments. In this disclosure, any defined meanings do not necessarily exclude ordinary and customary meanings in some embodiments.

Exemplary methods of forming a structure in accordance with exemplary embodiments of the disclosure include the steps of providing a substrate within a reaction chamber, providing a precursor to the reaction chamber, the precursor comprising a molecule comprising silicon and carbon, and applying plasma power to form a plasma within the reaction chamber. As noted above, the plasma power can be relatively low (e.g., a power density of less than 3.0 W/cm$^2$ or between about 0.5 and about 3.0 W/cm$^2$ of a planar surface area of the substrate exposed to the plasma to form the layer comprising silicon carbide. The relatively low power density can allow for certain chemical bonds of the precursor to remain intact—despite exposure of the precursor to the plasma.

During the step of providing a substrate within a reaction chamber, the substrate is provided into a reaction chamber of a gas-phase reactor. In accordance with examples of the disclosure, the reaction chamber can form part of a chemical vapor deposition (CVD) reactor, such as a plasma-enhanced CVD (PECVD) reactor. Various steps of methods described herein can be performed within a single reaction chamber.

During the step of providing a substrate within a reaction chamber, the substrate can be brought to a desired temperature and/or the reaction chamber can be brought to a desired pressure, such as a temperature and/or pressure suitable for subsequent steps. By way of examples, a temperature (e.g., of a substrate or a substrate support) within a reaction chamber can be between about 10° C. and about 250° C. A pressure within the reaction chamber can be from about 100 Pa to about 3,000 Pa. In accordance with particular examples of the disclosure, the substrate includes one or more features, such as recesses. An aspect ratio of the features can be, for example, between about 0.5 and about 15.0.

During the step of providing a precursor to the reaction chamber, a precursor for forming a layer of silicon carbide is introduced into the reaction chamber. Exemplary precursors include compounds or molecules including silicon and carbon. In some cases, the molecule consists of carbon, silicon, and hydrogen. In accordance with further examples, the molecule comprises a carbon-carbon triple bond. Additionally or alternatively, the molecule comprises two or more silicon atoms.

Further, a molecular weight of the of the molecule can be greater than 150 Da (e.g., between 150 and 300 Da).

Figure 3A:
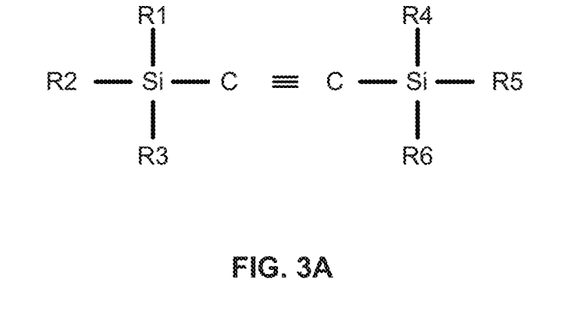
FIGS. 3A and 3B illustrate exemplary precursor molecules in accordance with embodiments of the disclosure.
Figure 3B:
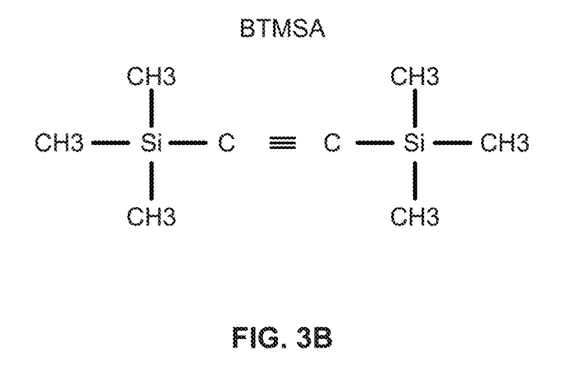

FIGS. 3A and 3B illustrate exemplary molecules suitable for use as a precursor. As illustrated in FIG. 3A, the molecule can include a carbon-carbon triple bond. In the illustrated example, each carbon of the carbon-carbon triple bond is bonded to a silicon atom. The molecule further comprises functional groups R1-R6, which can be independently selected functional groups, bound to the silicon atoms. In accordance with examples of the disclosure, R1-R6 can be independently selected from the group consisting Cx-Hy alkyl groups, where X ranges from 1 to 4, and Y ranges from 1 to 9.

For example, one or more of R1-R6 can include a methyl group. FIG. 3B illustrates an example in which each of R1-R6 is a methyl group (bis(trimethylsilyl)acetylene).

A flowrate of the precursor to the reaction chamber can be between about 500 and about 5,000 sccm.

During the step of applying plasma power to form a plasma within the reaction chamber, a power sufficient to form a plasma is applied to one or more electrodes within a reaction chamber. Exemplary electrodes and a reaction chamber are described in more detail below in connection with FIG. 5. An amount of power can depend on a surface area of the substrate (e.g., a top surface of the substrate, calculated as $\pi r^2$ for a circular substrate, without factoring the features (e.g., gaps, protrusions, and the like) on the substrate surface). The power density can be less than 3.0 W/cm$^2$ or between about 0.5 and about 3.0 W/cm$^2$ of the surface of the substrate. Additionally or alternatively, the power can be less than 300 W or between about 50 and about 300 W. A frequency of the power can be less than 30 MHz or between about 13.56 MHz and about 27.12 MHz.

During the step of providing a precursor to the reaction chamber and the step of applying plasma power to form a plasma, a carrier gas can be provided to the reaction chamber. As noted above, the carrier gas can be used to facilitate transportation of the precursor to the reaction chamber, facilitate ignition of a plasma, and/or facilitate maintenance of the plasma. A flowrate of the carrier gas to the reaction chamber can be from about 500 sccm to about 5,000 sccm. The carrier gas can be selected from, for example, the group consisting of one or more of argon, helium, hydrogen, nitrogen.

Methods described herein can be or include a PECVD process. In some cases, the method can include a single, non-cyclical deposition process.

Figure 1:
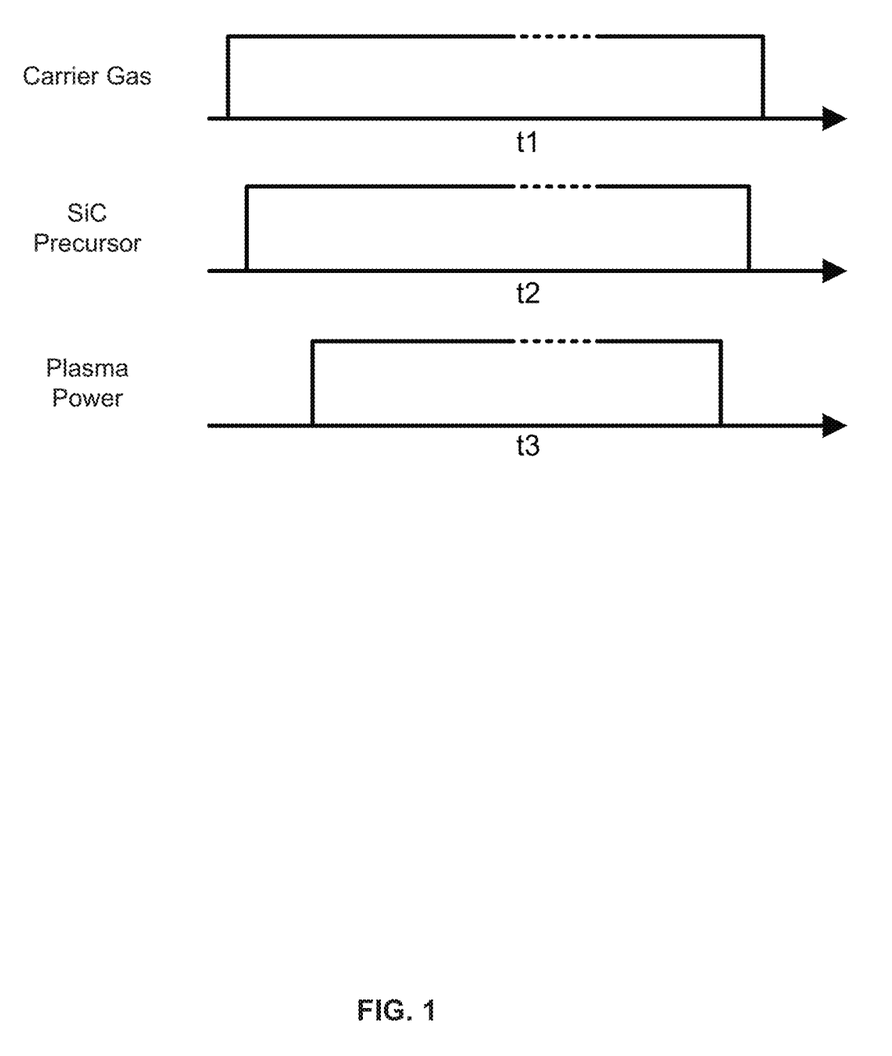
FIG. 1 illustrates a timing sequence of a method in accordance with exemplary embodiments of the disclosure.

FIG. 1 illustrates an exemplary timing sequence for a PECVD process. As illustrated, a carrier gas can be flowed to a reaction chamber for a period t1. The precursor can be flowed to the reaction chamber for a period t2. And, the plasma power to ignite and maintain a plasma can be provided for a period t3. As illustrated, the step of providing the precursor and the step of applying plasma power overlap in time. Further, the step of providing the precursor can begin prior to the step of applying plasma power beginning. Additionally or alternatively, the step of applying plasma power can end prior to the step of providing the precursor and/or carrier gas ending. Additionally or alternatively, t1 can begin prior to t2 and/or t3 and/or end after t2 and/or t3. Although not illustrated, in some cases, the silicon carbide precursor can be pulsed to the reaction chamber. In these cases, each pulse period can be between about 3.0 and about 1,800.0 seconds.

Figure 2:
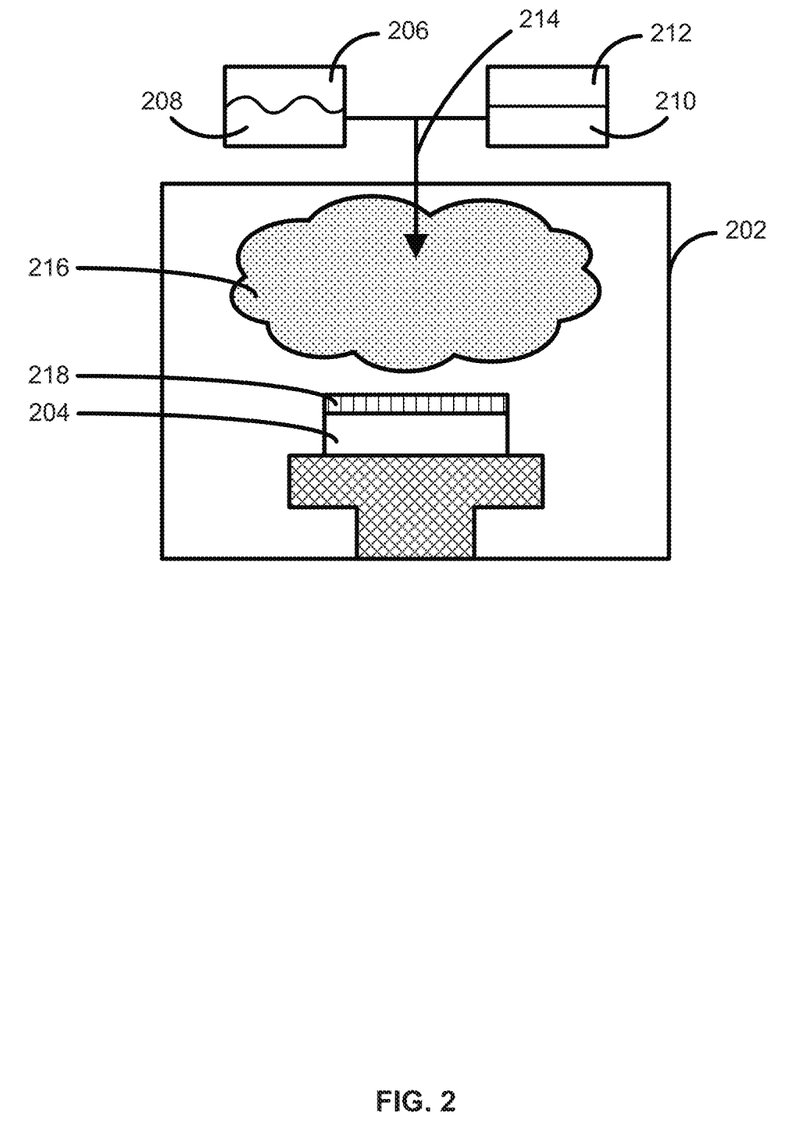
FIG. 2 illustrates a system and a reaction mechanism in accordance with examples of the disclosure.

FIG. 2 illustrates deposition of a silicon carbide layer 218 on a surface of a substrate 204 within a reaction chamber 202. In the illustrated example, a combination 214 of a precursor 208 from a precursor source 206 with a carrier gas 210 from a carrier gas source 212 are flowed to reaction chamber 202. In the illustrated example, functional groups (e.g., R1-R6 is the molecule illustrated in FIG. 3A) can be removed from the precursor molecule using plasma 216, such that the carbon-carbon triple bond and the carbon-silicon bonds remain substantially intact. The remaining portion of the molecules can polymerize to form an initially flowable silicon carbide layer, which solidifies as silicon carbide layer 218.

Figure 4:
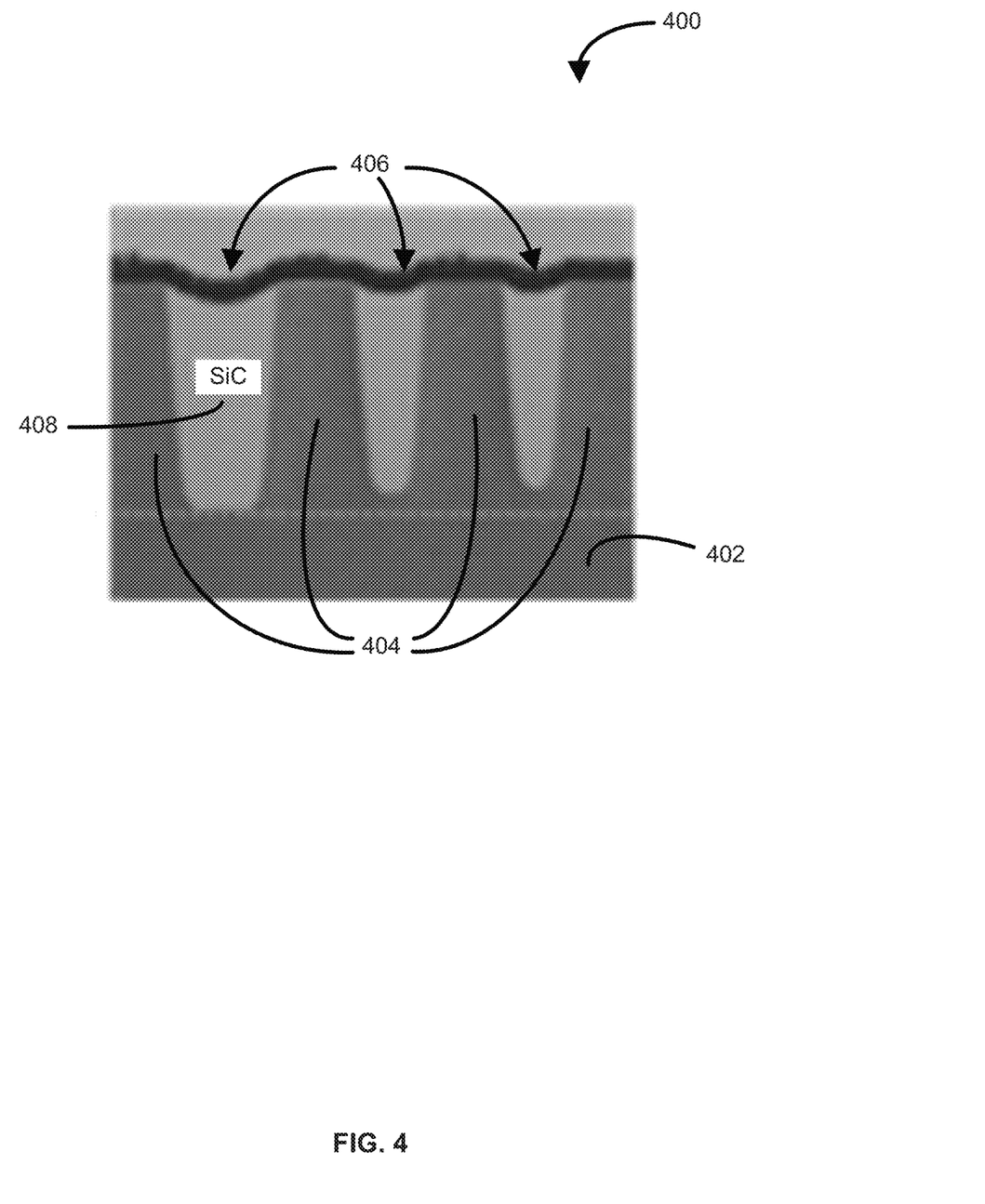
FIG. 4 illustrates a structure in accordance with exemplary embodiments of the disclosure.

The methods described herein can be used to fill features on a surface of a substrate in a void-free manner. FIG. 4 illustrates a structure 400 formed in accordance with a method described herein. Structure 400 includes a substrate 402 having protrusions 404 formed thereon and features (e.g., trenches, gaps, or recesses) 406. Silicon carbide 408 is formed within recesses 406.

Figure 5:
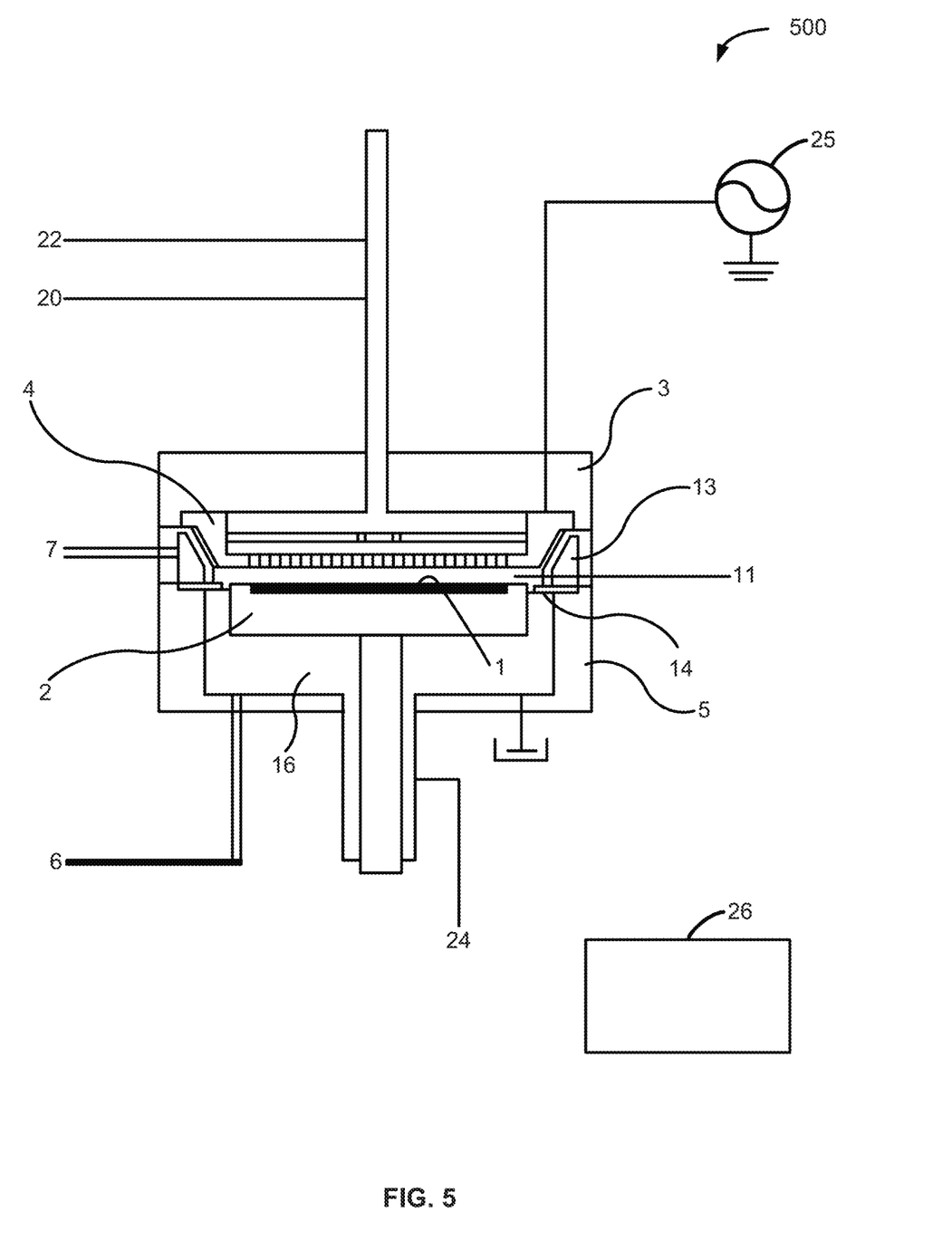
FIG. 5 illustrates a system in accordance with exemplary embodiments of the disclosure.

FIG. 5 illustrates a reactor system 500 in accordance with exemplary embodiments of the disclosure. Reactor system 500 can be used to perform one or more steps or sub steps as described herein and/or to form one or more structures or portions thereof as described herein.

Reactor system 500 includes a pair of electrically conductive flat-plate electrodes 4, 2 in parallel and facing each other in the interior 11 (reaction zone) of a reaction chamber 3. A plasma can be excited within reaction chamber 3 by applying plasma power from power source 25 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature. Electrode 4 can serve as a gas distribution device, such as a shower plate. Precursor gas and carrier gas and/or the like can be introduced into reaction chamber 3 using one or more of a gas line 20 and a gas line 22. The gas can flow through shower plate 4. Although illustrated with two gas lines, reactor system 500 can include any suitable number of gas lines.

In reaction chamber 3, a circular duct 13 with an exhaust line 7 is provided, through which gas in the interior 11 of the reaction chamber 3 can be exhausted. Additionally, a transfer chamber 5, disposed below the reaction chamber 3, is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6.

In some embodiments, continuous flow of a carrier gas to reaction chamber 3 can be accomplished using a flow-pass system (FPS), wherein a carrier gas line is provided with a detour line having a precursor reservoir (bottle), and the main line and the detour line are switched, wherein when only a carrier gas is intended to be fed to a reaction chamber, the detour line is closed, whereas when both the carrier gas and a precursor gas are intended to be fed to the reaction chamber, the main line is closed and the carrier gas flows through the detour line and flows out from the bottle together with the precursor gas. In this way, the carrier gas can continuously flow into the reaction chamber, and can carry the precursor for a period shorter than the carrier gas period.

A skilled artisan will appreciate that the apparatus includes one or more controller(s) 26 programmed or otherwise configured to cause one or more method steps as described herein to be conducted. The controller(s) are communicated with the various power sources, heating systems, pumps, robotics and gas flow controllers, or valves of the reactor, as will be appreciated by the skilled artisan.

In some embodiments, a dual chamber reactor (two sections or compartments for processing wafers disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of forming a structure comprising a layer comprising silicon carbide, the method comprising the steps of:
   providing a substrate within a reaction chamber;
   providing a precursor to the reaction chamber using a carrier gas, the precursor consisting essentially of molecules, each molecule comprising silicon and carbon;
   after the step of providing the precursor has begun, while continuing to supply the precursor to the reaction chamber, applying plasma power to form a plasma within the reaction chamber, where the plasma power is less than 3.0 W/cm$^2$ surface area of the substrate exposed to the plasma to form initially flowable silicon carbide material that becomes the layer comprising silicon carbide,
   wherein each molecule comprises two or more silicon atoms and a carbon-carbon triple bond,
   wherein the plasma is formed and maintained from a gas consisting of the carrier gas and the precursor,
   wherein the step of applying plasma power ends prior to the step of providing the precursor ending,
   wherein the method is not cyclic,
   wherein the carrier gas comprises one or more of N$_2$ and H$_2$,
   wherein a temperature within the reaction chamber is less than 120° C.,
   wherein the initially flowable silicon carbide material flows within a gap on a surface of the substrate to fill the gap, and
   wherein each molecule is represented by the general formula:

where R1-R6 is independently selected from the group consisting of Cx-Hy alkyl groups, where X ranges from 1 to 4 and Y ranges from 1 to 9.

2. The method of claim 1, wherein a molecular weight of the molecule is greater than 150 Da.

3. The method of claim 1, wherein at least one of R1-R6 is a methyl group.

4. The method of claim 1, wherein each molecule comprises bis(trimethylsilyl) acetylene.

5. The method of claim 1, wherein the plasma power is between about 50 and about 300 W.

6. The method of claim 1, wherein the plasma power is between about 0.5 and about 3.0 W/cm$^2$ of the surface of the substrate.

7. The method of any of claim 1, wherein a frequency of the plasma power is between about 13.56 MHz and about 27.12 MHz.

8. The method of claim 1, wherein the carrier gas consists of one or more of argon or helium and the one or more of hydrogen and nitrogen.

9. The method of claim 1, wherein the method is a plasma-enhanced chemical deposition method.

10. The method of claim 1, wherein a pressure within the reaction chamber during the step of applying is between about 100 Pa and about 3,000 Pa.

11. A method of filling a trench on a surface of a substrate using the method of claim 1.

12. The method of claim 11, wherein an aspect ratio of the trench is greater than 0.5.

13. The method of any of claim 1, wherein the carrier gas consists of argon, helium, and hydrogen.

* * * * *